US012707582B2

(12) United States Patent
Tang et al.

(10) Patent No.: US 12,707,582 B2
(45) Date of Patent: Aug. 11, 2026

(54) FPC MOUNTING MODULE, ELECTRONIC DEVICE, AND MOUNTING METHOD

(71) Applicant: HUAWEI TECHNOLOGIES CO., LTD., Shenzhen (CN)

(72) Inventors: Dianying Tang, Shanghai (CN); Jie Liu, Shanghai (CN); Jiafeng Ding, Shanghai (CN); Min Zhang, Shanghai (CN); Hao Zhang, Suzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 186 days.

(21) Appl. No.: 18/688,589

(22) PCT Filed: Aug. 15, 2022

(86) PCT No.: PCT/CN2022/112469

§ 371 (c)(1),
(2) Date: Mar. 1, 2024

(87) PCT Pub. No.: WO2023/029963

PCT Pub. Date: Mar. 9, 2023

(65) Prior Publication Data

US 2025/0126734 A1 Apr. 17, 2025

(30) Foreign Application Priority Data

Sep. 2, 2021 (CN) ......................... 202111026212.3

(51) Int. Cl.
*H05K 1/18* (2026.01)
*H04M 1/02* (2006.01)
(Continued)

(52) U.S. Cl.
CPC .......... *H05K 5/065* (2013.01); *H04M 1/0277* (2013.01); *H04M 1/18* (2013.01); *H04M 1/0214* (2013.01); *H05K 1/189* (2013.01)

(58) Field of Classification Search
CPC ..... H05K 5/065; H05K 1/189; H04M 1/0277; H04M 1/18; H04M 1/0214
(Continued)

(56) References Cited

U.S. PATENT DOCUMENTS 7,251,512 B2 * 7/2007 Komiyama ......... H04M 1/0214 439/165
8,003,898 B2 * 8/2011 Hayashi ............... H05K 9/0015 174/385
(Continued)

FOREIGN PATENT DOCUMENTS

CN 206181018 U 5/2017
CN 208637350 U 3/2019
(Continued)

*Primary Examiner* — Binh B Tran
(74) *Attorney, Agent, or Firm* — WOMBLE BOND DICKINSON (US) LLP

(57) ABSTRACT

A FPC mounting module includes a mounting part and an FPC. The mounting part is provided with a mounting hole, the FPC penetrates the mounting hole, and there is a gap between the FPC and an inner wall surface of the mounting hole. A first surface of the FPC is glued to a first wall surface of the mounting hole by using a first adhesive part. The gap is filled with flowing adhesive, to form a second adhesive part. The FPC is sealed in and fastened to the mounting hole by using the second adhesive part.

13 Claims, 9 Drawing Sheets

(51) Int. Cl.
*H04M 1/18* (2006.01)
*H05K 5/06* (2006.01)
*H05K 1/189* (2026.01)

(58) Field of Classification Search
USPC .......................................................... 361/748
See application file for complete search history.

(56) References Cited

U.S. PATENT DOCUMENTS

| | | | | |
|---|---|---|---|---|
| 8,106,312 | B2 * | 1/2012 | Shinoda | H05K 5/069<br>174/554 |
| 8,178,794 | B2 * | 5/2012 | Hayashi | H05K 1/0281<br>174/60 |
| 2009/0250261 | A1 * | 10/2009 | Hayashi | H05K 9/0015<br>174/377 |
| 2010/0176533 | A1 * | 7/2010 | Hayashi | B29C 45/14418<br>264/252 |

FOREIGN PATENT DOCUMENTS

| | | | |
|---|---|---|---|
| CN | 110167304 | A | 8/2019 |
| CN | 210781745 | U | 6/2020 |
| CN | 213783867 | U | 7/2021 |
| JP | 2012074526 | A | 4/2012 |

* cited by examiner

FPC MOUNTING MODULE, ELECTRONIC DEVICE, AND MOUNTING METHOD

This application is a National Stage of International Application No. PCT/CN2022/112469 filed on Aug. 15, 2022, which claims priority to Chinese Patent Application No. 202111026212.3 filed on Sep. 2, 2021. Both of the aforementioned applications are hereby incorporated by reference in their entireties.

TECHNICAL FIELD

This application relates to the field of electronic device waterproofing, and in particular, to a flexible printed circuit (FPC) mounting module, an electronic device, and a mounting method.

BACKGROUND

With the update of electronic devices, waterproof performance of the electronic devices attracts increasing attention from the public. Because some openings or gaps are usually disposed on a housing of an electronic device, these openings or gaps have a high water penetration risk. For example, an assembly gap is disposed between a button of the electronic device and the housing of the electronic device. For another example, for some foldable electronic devices, the foldable electronic devices usually need to rotate or bend devices on two sides of a rotating shaft by using the rotating shaft. Therefore, safe gaps need to be disposed between the devices on the two sides of the rotating shaft and between the devices and the rotating shaft, to satisfy rotation space required for bending the foldable electronic devices.

Therefore, water may enter the electronic device through the foregoing various gaps, and may corrode inside of the electronic device and cause damage to the electronic device.

It can be learned that an electronic device in the conventional technology has a high water penetration risk and poor waterproof performance.

SUMMARY

An objective of this application is to resolve a problem that in the conventional technology, an electronic device has a high water penetration risk and poor waterproof performance. Therefore, embodiments of this application provide an FPC mounting module, an electronic device, and a mounting method. This makes the electronic device have good waterproof performance, and helps enable the FPC to adapt to more mounting scenarios.

An embodiment of this application provides an FPC mounting module, including a mounting part and an FPC, where the mounting part is provided with a mounting hole, the FPC penetrates the mounting hole, and there is a gap between the FPC and an inner wall surface of the mounting hole;

a first surface of the FPC is glued to a first wall surface of the mounting hole by using a first adhesive part; and the gap is filled with flowing adhesive, to form a second adhesive part, and the FPC is sealed in and fastened to the mounting hole by using the second adhesive part.

In this embodiment of this application, the first adhesive part can make the first surface of the FPC closely attached to the first wall surface of the mounting hole. In this way, a sealing effect between the FPC and the first wall surface of the mounting hole is ensured. Further, the gap between the FPC and the mounting hole is filled by using the second adhesive part formed by the flowing adhesive, the FPC is sealed in and fastened to the mounting hole, and a closed sealing structure is formed around the FPC. This prevents water from eroding the electronic device after entering the electronic device from the gap between the mounting hole and the FPC, and causing damage to the electronic device. Still further, compared with a conventional FPC mounting solution, because the flowing adhesive has specific fluidity, and can well fill and seal a narrow and abnormal-shaped gap inside the electronic device, this embodiment can match mounting holes of different shapes, and helps enable the FPC to adapt to more mounting scenarios.

In some embodiments, the FPC mounting module further includes a bracket and a third adhesive part, the bracket is glued to a second surface of the FPC by using the third adhesive part, the second surface of the FPC backs onto the first surface, the bracket is press-fitted between the third adhesive part and a second wall surface of the mounting hole, and the second wall surface of the mounting hole backs onto the first wall surface; and the FPC, the first adhesive part, the bracket, and the third adhesive part are all sealed in and fastened to the mounting hole by using the second adhesive part.

In embodiments of this application, spacing between the second surface of the FPC and the second wall surface of the mounting hole can be reduced by using the bracket and the third adhesive part, so that a filling amount of the flowing adhesive can be reduced, and this helps avoid a phenomenon that flowing adhesive overflows from the mounting hole when a filling amount of the flowing adhesive is large during processing.

In some possible embodiments, the FPC mounting module further includes foam adhesive, the foam adhesive is fastened between the second surface of the FPC and the second wall surface of the mounting hole, and the FPC, the first adhesive part, and the foam adhesive are all sealed in and fastened to the mounting hole by using the second adhesive part.

In this embodiment, the bracket and the third adhesive part may be replaced by using the foam adhesive to reduce the spacing between the second surface of the FPC and the second wall surface of the mounting hole. In this way, a filling amount of the flowing adhesive is reduced, and this helps avoid the phenomenon that flowing adhesive overflows the mounting hole when a filling amount of the flowing adhesive is large during processing. Further, because the foam adhesive has a gluing function and has a specific thickness, a mounting structure is simpler, and mounting operations are simplified.

In some embodiments, in a width direction of the FPC, the FPC is located between two opposite side edges of the first adhesive part, the third adhesive part is located between two opposite side edges of the FPC, and the bracket is located between two opposite side edges of the third adhesive part.

In some possible embodiments, in the width direction of the FPC, two sides of a cross section of an overall structure formed by the first adhesive part, the FPC, the third adhesive part, and the bracket are all in a step shape.

In embodiments of this application, the foregoing structure can help avoid a phenomenon that a part of the gap is not filled due to poor fluidity of the flowing adhesive during processing.

In some embodiments, both the first adhesive part and the third adhesive part are double-sided adhesive.

In some embodiments, a cross-sectional shape of the mounting hole is a trapezoid.

This application further provides an electronic device, including the FPC mounting module in the foregoing embodiments.

In some possible embodiments, the electronic device has a button, and a side frame that is in a middle frame of the electronic device and that is disposed opposite to the button and a rear cover of the electronic device form the mounting part; and a mounting slot is disposed on the side frame of the middle frame, and the mounting slot and the rear cover of the electronic device are enclosed to form the mounting hole.

In some embodiments, the electronic device is a foldable electronic device, the foldable electronic device includes a first device body, a second device body, and a rotating shaft, and the first device body and the second device body are rotatably connected by using the rotating shaft.

The first device body has a middle frame and a rear cover, the rear cover and a side frame that is in the middle frame and that is close to the rotating shaft form the mounting part, a mounting slot is disposed on the side frame of the middle frame, and the mounting slot and the rear cover are enclosed to form the mounting hole.

In some embodiments, the electronic device is a foldable electronic device, the foldable electronic device includes a first device body, a second device body, and a rotating shaft, and the first device body and the second device body are rotatably connected by using the rotating shaft.

There are a plurality of FPC mounting modules, and the plurality of FPC mounting modules include a first FPC mounting module and a second FPC mounting module; a rear cover of the first device body and a side frame that is in a middle frame of the first device body and that is close to the rotating shaft form a mounting part of the first FPC mounting module, a first mounting slot is disposed on the side frame of the first device body, and the first mounting slot and the rear cover are enclosed to form a mounting hole of the first FPC mounting module.

The electronic device has a button, a side frame that is in a middle frame of the electronic device and that is disposed opposite to the button and a rear cover of the electronic device form a mounting part of the second FPC mounting module, a second mounting slot is disposed on the side frame that is in the middle frame of the electronic device and that is disposed opposite to the button, and the second mounting slot and the rear cover of the electronic device are enclosed to form a mounting hole of the second FPC mounting module.

Embodiments of this application can effectively prevent water from entering the rotating shaft and the button of the foldable electronic device.

This application further provides a method for mounting an FPC mounting module in the foregoing embodiments, including: gluing the first surface of the FPC to the first wall surface of the mounting hole by using the first adhesive part; and filling the gap with the flowing adhesive to form the second adhesive part, so that the gap is sealed.

In some embodiments, before the filling the gap with the flowing adhesive to form the second adhesive part, so that the gap is sealed, the method further includes: fastening the bracket to the second surface of the FPC by using the third adhesive part, so that the bracket is press-fitted between the FPC and the second wall surface of the mounting hole.

DESCRIPTIONS OF REFERENCE NUMERALS

Figure 1A:
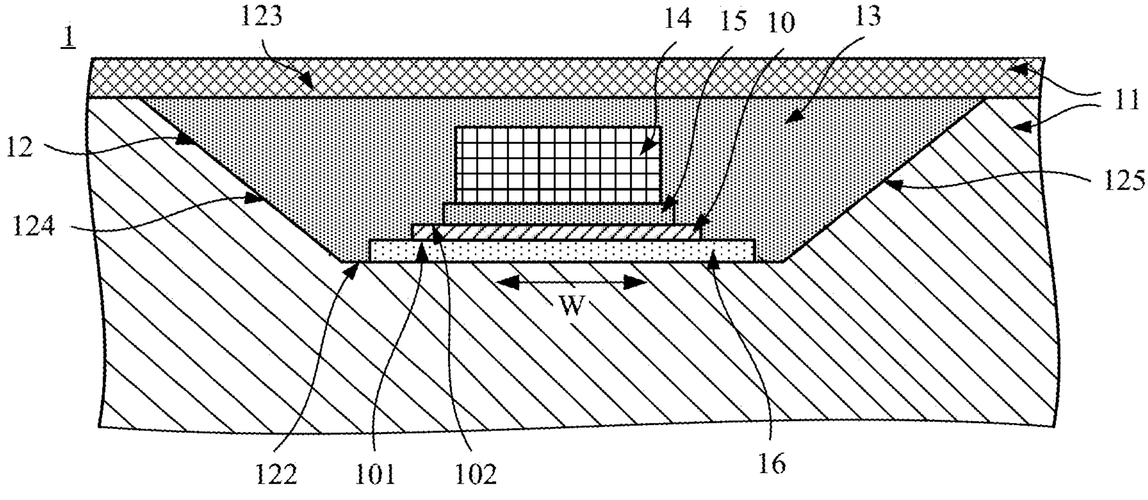
FIG. 1*a* is a schematic diagram of a sectional view structure of an FPC mounting module in a width direction of an FPC according to an embodiment of this application, where a mounting part is of a detachable structure.

1: FPC mounting module;

10: FPC; 101: first surface; 102: second surface;

11: mounting part;

12: mounting hole; 121: gap; 122: first wall surface; 123: second wall surface; 124: third wall surface; 125:

fourth wall surface; 13: second adhesive part; 14: bracket; 15: third adhesive part; 16: first adhesive part;

1A: FPC mounting module;

10A: FPC;

11A: mounting part;

120A: mounting slot; 121A: gap; 122A: first wall surface; 123A: second wall surface; 13A: second adhesive part; 14A: bracket; 15A: third adhesive part; 16A: first adhesive part;

1B: FPC mounting module;

10B: FPC;

120B: mounting slot; 121B: gap; 122B: first wall surface; 13B: second adhesive part; 14B: bracket; 141B: concave part; 15B: third adhesive part; 16B: first adhesive part;

2: electronic device;

20: gap; 21: first device body; 211: middle frame; 2111: side frame; 2112: side frame; 212: rear cover; 2121: back adhesive line; 22: second device body; 221: middle frame; and 23: rotating shaft.

DESCRIPTION OF EMBODIMENTS

The following describes implementations of this application by using specific embodiments. A person skilled in the art may easily learn of other advantages and effects of this application based on content disclosed in this specification. Although this application is described with reference to some embodiments, it does not mean that a characteristic of this application is limited only to this implementation. On the contrary, a purpose of describing this application with reference to an implementation is to cover another option or modification that may be derived based on claims of this application. To provide an in-depth understanding of this application, the following descriptions include a plurality of specific details. This application may be alternatively implemented without using these details. In addition, to avoid confusion or blurring a focus of this application, some specific details are omitted from the description. It should be noted that embodiments in this application and the features in embodiments may be mutually combined in the case of no conflict.

It should be noted that, in this specification, similar reference numerals and letters in the following accompanying drawings represent similar items. Therefore, once an item is defined in an accompanying drawing, the item does not need to be further defined or interpreted in the following accompanying drawings.

In descriptions of this application, it is to be noted that orientation or location relationships indicated by terms “center”, “above”, “below”, “left”, “right”, “vertical”, “horizontal”, “inner”, “outer”, and the like are orientation or location relationships based on the accompanying drawings, and are merely intended for conveniently describing this application and simplifying descriptions, rather than indicating or implying that an apparatus or an element in question needs to have a specific orientation or needs to be constructed and operated in a specific orientation, and therefore cannot be construed as a limitation on this application. In addition, terms “first” and “second” are merely used for a purpose of description, and shall not be understood as an indication or implication of relative importance.

In descriptions of this application, it is to be noted that unless otherwise expressly specified and limited, terms “mount”, “interconnect”, and “connect” should be understood in a broad sense. For example, the terms may indicate a fixed connection, a detachable connection, or an integral connection; may be a mechanical connection or an electrical connection; or may be direct interconnection, indirect interconnection through an intermediate medium, or communication between the interior of two elements. For a person of ordinary skill in the art, a specific meaning of the foregoing terms in this application may be understood according to a specific situation.

In descriptions of this application, it should be understood that, in this application, “electrical connection” may be understood that components contact physically and conduct electrically. It may also be understood as a form in which different components in a line structure are connected through physical lines that can transmit an electrical signal, such as a printed circuit board ((PCB) copper foil or a conducting wire. To make objectives, technical solutions, and advantages of this application clearer, the following further describes implementations of this application in detail with reference to accompanying drawings.

Figure 1B:
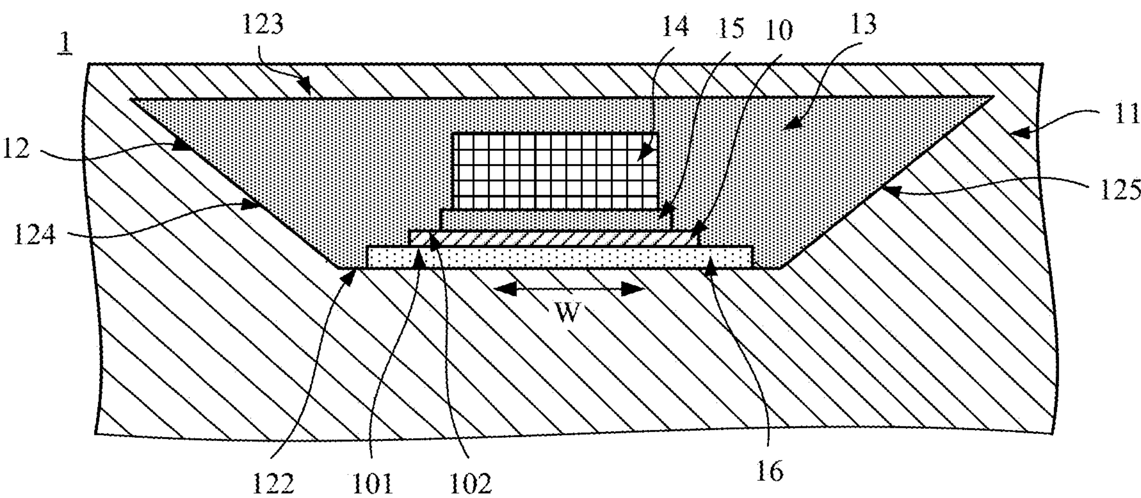
FIG. 1*b* is a schematic diagram of a sectional view structure of an FPC mounting module in a width direction of an FPC according to an embodiment of this application, where a mounting part is of an integrated structure.
Figure 1C:
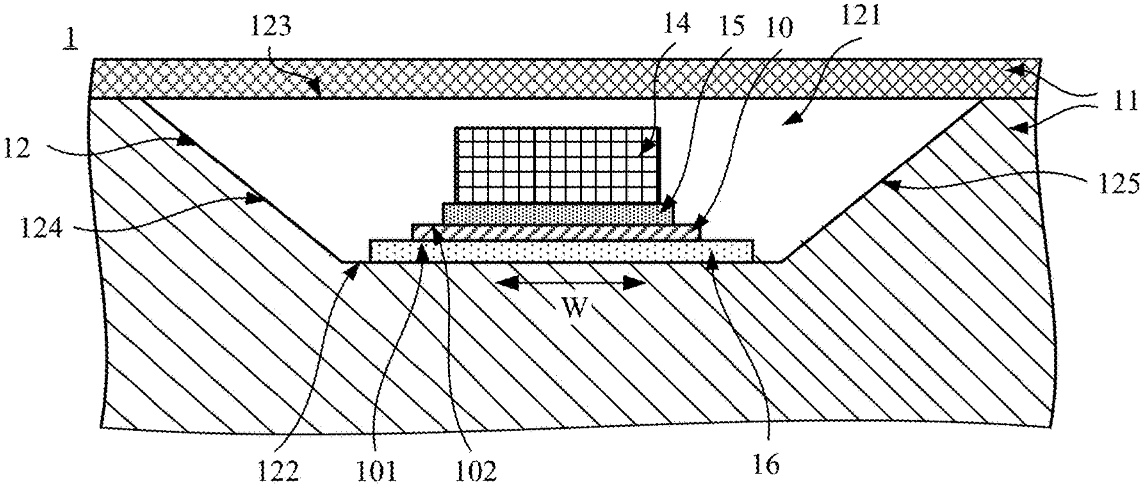
FIG. 1*c* is a schematic diagram of a sectional view structure of an FPC mounting module that is not filled with flowing adhesive in a width direction of an FPC according to an embodiment of this application, where a mounting part is of a detachable structure.

Refer to FIG. 1*a* to FIG. 1*c*. FIG. 1*a* is a schematic diagram of a sectional view structure of an FPC mounting module in a width direction of an FPC according to an embodiment of this application, where a mounting part is of a detachable structure. FIG. 1*b* is a schematic diagram of a sectional view structure of an FPC mounting module in a width direction of an FPC according to an embodiment of this application, where a mounting part is of an integrated structure. FIG. 1*c* is a schematic diagram of a sectional view structure of an FPC mounting module that is not filled with flowing adhesive in a width direction of an FPC according to an embodiment of this application.

Refer to FIG. 1*a*. An FPC mounting module 1 provided in this application includes a mounting part 11 and an FPC 10. The mounting part 11 is provided with a mounting hole 12, the FPC 10 penetrates the mounting hole 12, and there is a gap 121 (as shown in FIG. 1*c*) between the FPC 10 and an inner wall surface of the mounting hole 12.

Specifically, the inner wall surface of the mounting hole 12 includes a first wall surface 122 and a second wall surface 123 that are disposed opposite to each other, and a third wall surface 124 and a fourth wall surface 125 that are disposed opposite to each other. The third wall surface 124, the first wall surface 122, the second wall surface 123, and the fourth wall surface 125 are sequentially connected to form the mounting hole 12.

The gap 121 (as shown in FIG. 1*c*) between the FPC 10 and the inner wall surface of the mounting hole 12 may be safe space formed for ease of assembly, or may be safe space designed to meet another requirement.

In a width direction W of the FPC, a cross-sectional shape of the mounting hole 12 is not limited, and may be a rectangular shape, for example, a square or an oblong, or may be a trapezoid (as shown in FIG. 1*a*), or may be an irregular shape. Alternatively, it may be understood that the third wall surface 124 and the fourth wall surface 125 of the mounting hole 12 may be both perpendicular to the first wall surface 122, or may not be perpendicular to the first wall surface 122. The third wall surface 124 and the fourth wall surface 125 may be, for example, oblique surfaces or curved surfaces.

In some implementations, as shown in FIG. 1*a*, the mounting hole 12 may be formed by enclosing different mechanical parts in the electronic device. Alternatively, it may be understood that the mounting part 11 is of a detachable structure. Specifically, for example, the mounting hole 12 may be formed by enclosing a rear cover of the electronic device and a middle frame of the electronic device. In this way, the first wall surface 122 of the mounting hole 12 may be a part of the middle frame, the second wall surface 123 of the mounting hole 12 may be formed by a surface that is of the rear cover of the electronic device and that is close to the middle frame. Specifically, an example in which the electronic device is a mobile phone is used, and the rear cover may be a battery cover of the mobile phone. In some other implementations, as shown in FIG. 1*b*, the mounting hole 12 may be disposed on the middle frame of the electronic device. Therefore, the first wall surface 122, the second wall surface 123, the third wall surface 124, and the fourth wall surface 125 of the mounting hole 12 each are a part of the middle frame. Alternatively, it may be understood that the mounting part 11 is of an integrated structure. For example, the mounting part 11 may be formed by directly opening a hole on the middle frame.

A first surface 101 of the FPC 10 is glued to the first wall surface 122 of the mounting hole 12 by using a first adhesive part 16 (as shown in FIG. 1*a*). The gap is filled with flowing adhesive, to form a second adhesive part 13. The FPC is sealed in and fastened to the mounting hole 12 by using the second adhesive part 13.

The first adhesive part 16 may be, for example, double-sided adhesive or back adhesive, or may be foam adhesive, or may be an adhesive part formed after flowing adhesive is filled between the first surface 101 of the FPC and the first wall surface 122 of the mounting hole by using a gel dispensing process and the flowing adhesive is solidified. The scope of this embodiment is not departed from provided that the FPC can be glued to the mounting hole 12. In addition, a thickness of the first adhesive part 16 is not limited, and may be selected based on a size of the mounting hole 12, for example, may be 0.1 mm to 0.5 mm.

Further, the first adhesive part 16 may glue the FPC to a part of a wall surface of the first wall surface 122 of the mounting hole 12, or may glue the FPC to an entire wall surface of the first wall surface 122 of the mounting hole 12.

The flowing adhesive may be understood as adhesive that has specific viscosity and fluidity and that can gradually form bonding force between glued objects over time, for example, silicone adhesive, UV adhesive, or hot melt adhesive. A model of the adhesive is not limited. The scope of this application is not departed from provided that the adhesive is flowing adhesive that has specific fluidity, and can be solidified in a form of heating, being left still, or UV lamp illumination.

In an example of an installation process, a part of the flowing adhesive may be filled between the first surface 101 of the FPC 10 and the first wall surface 122 of the mounting hole 12 by using the gel dispensing process, to form the first adhesive part, and then the other part of the flowing adhesive is filled in the gap 121 by using the gel dispensing process, to form the second adhesive part, to fasten and seal the FPC into the mounting hole 12. The first adhesive part and the second adhesive part may be separately formed through gel dispensing by using the gel dispensing process, or may be formed by integral dispensing in the mounting hole by using the gel dispensing process. During gel dispensing, the first adhesive part 16 is first formed on the first wall surface 122 of the mounting hole and the first surface 101 of the FPC, and the second adhesive part 13 is formed at the gap.

It should be understood that the FPC mounting module 1 in this application may be applied to any scenario in which an FPC is assembled and water needs to be prevented from entering an FPC mounting location, for example, may be applied to an FPC at a button in an electronic device, or may be applied to an FPC that needs to be bent in a foldable electronic device. A type of the electronic device is not limited, and may be, for example, an intelligent electronic device like a mobile phone, a smartwatch, or a smart home device, or may be, for example, another electronic device like a remote control or a wearable device. Further, a type of a button is not limited, for example, may be a fingerprint button, a lock screen button, or a control button.

In this application, the first adhesive part 16 can make the first surface 101 of the FPC 10 closely attached to the first wall surface 122 of the mounting hole 12. In this way, a sealing effect between the FPC 10 and the first wall surface 122 of the mounting hole 12 is ensured. Further, the gap 121 between the FPC 10 and the mounting hole 12 is filled by using the second adhesive part 13 formed by the flowing adhesive, the FPC 10 is sealed in and fastened to the mounting hole 12, and a closed sealing structure is formed around the FPC 10. This prevents water from eroding the electronic device after entering the electronic device from the gap 121 between the mounting hole 12 and the FPC 10, and causing damage to the electronic device. Still further, compared with a conventional FPC mounting solution, because the flowing adhesive has specific fluidity, and can well fill and seal a narrow and abnormal-shaped gap inside the electronic device, this embodiment can match mounting holes of different shapes, and helps enable the FPC 10 to adapt to more mounting scenarios.

Further, refer to FIG. 1*a* and FIG. 1*b*. The FPC mounting module 1 further includes a bracket 14 and a third adhesive part 15. The bracket 14 is glued to the second surface 102 of the FPC by using the third adhesive part 15, and the second surface 102 of the FPC is opposite to the first surface 101. The bracket 14 is press-fitted between the third adhesive part 15 and the second wall surface 123 of the mounting hole 12, and the second wall surface 123 of the mounting hole 12 is opposite to the first wall surface 122. The FPC 10, the first adhesive part 16, the bracket 14, and the third adhesive part 15 each are sealed in and fastened to the mounting hole 12 by using the second adhesive part 13 formed by the flowing adhesive.

The third adhesive part 15 may be, for example, double-sided adhesive or back adhesive. The scope of this embodiment is not departed from provided that the FPC can be glued to the bracket 14. A thickness of the third adhesive part 15 is not limited, and may be selected based on a size of a distance between the FPC and the second wall surface of the mounting hole, for example, may be 0.1 mm to 0.5 mm.

In another alternative implementation, the bracket 14 and the third adhesive part 15 may be replaced as a whole with foam adhesive, a surface that is of the foam adhesive and that is close to the FPC is glued to the second surface 102 of the FPC, and the foam adhesive is press-fitted between the FPC and the second wall surface 123 of the mounting hole 12.

In this embodiment of this application, the bracket 14 and the third adhesive part 15 may be used to reduce a distance between the second surface 102 of the FPC and the second wall surface 123 of the mounting hole. In this way, a filling amount of the flowing adhesive can be reduced, and this helps avoid a phenomenon that the flowing adhesive overflows the mounting hole when a filling amount of the flowing adhesive is large during processing. In addition, because the bracket 14 is press-fitted on a surface of the FPC, the FPC can be prevented from being arched and deformed when being bent in an application scenario in which the FPC needs to be bent (for example, a foldable electronic device).

Figure 2:
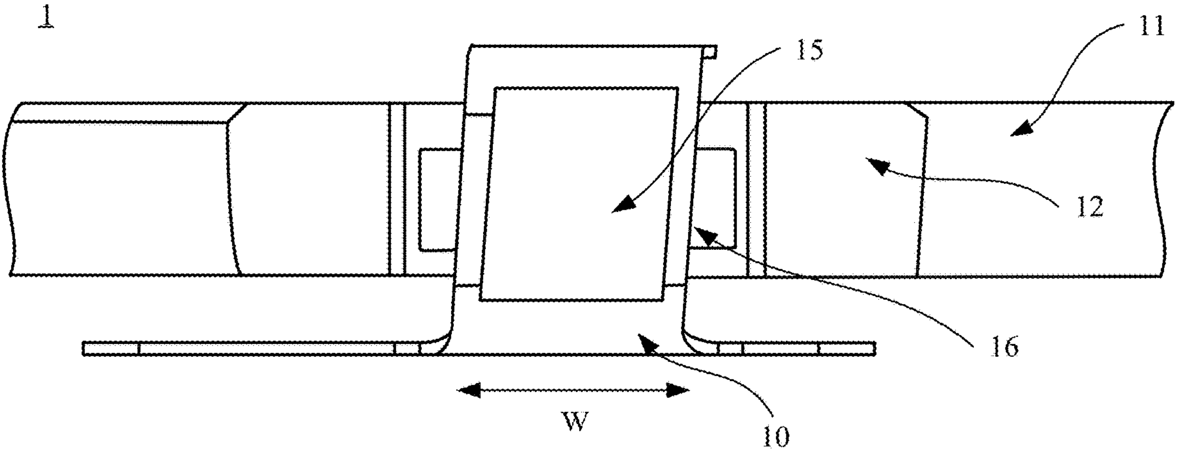
FIG. 2 is a schematic diagram that is of a partial top view structure of an FPC mounting module and that is obtained when no flowing adhesive is filled according to an embodiment of this application.
Figure 3:
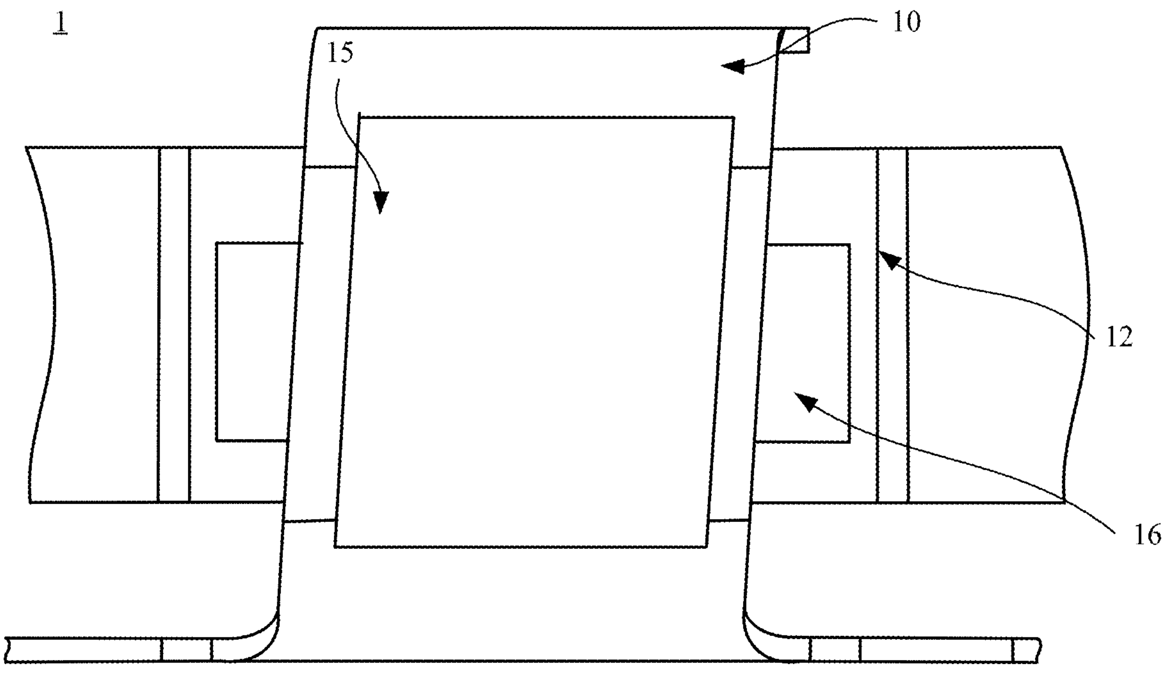
FIG. 3 is a schematic diagram of a partially enlarged structure of FIG. 2.
Figure 4:
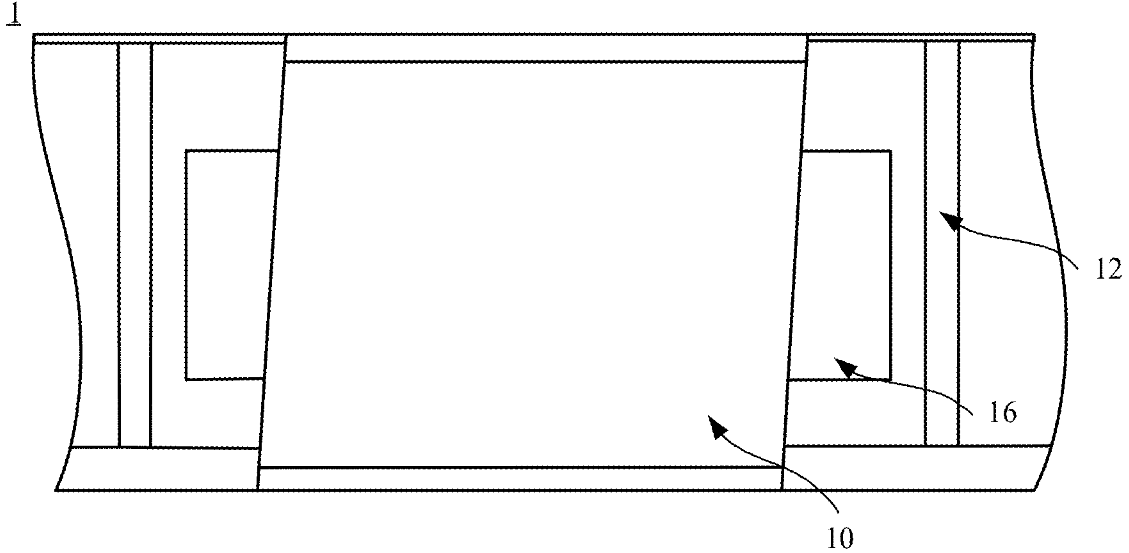
FIG. 4 is a schematic diagram of a top-view structure of a first adhesive part and an FPC in an FPC mounting module according to an embodiment of this application.

Further, refer to FIG. 2 to FIG. 4. With reference to FIG. 1*a*, FIG. 2 is a schematic diagram that is of a partial top view structure of an FPC mounting module and that is obtained when no flowing adhesive is filled according to an embodiment of this application. FIG. 3 is a schematic diagram of a partially enlarged structure of FIG. 2. FIG. 4 is a schematic diagram of a top-view structure of a first adhesive part and an FPC in an FPC mounting module according to an embodiment of this application.

In the width direction W (as shown by an arrow in the figure) of the FPC 10, the FPC 10 is located between two opposite side edges of the first adhesive part 16, and the third adhesive part 15 is located between two opposite side edges of the FPC 10. As shown in FIG. 1*a*, the bracket 14 is located between two opposite side edges of the third adhesive part 15. Alternatively, it may be understood that, in the width direction W (as shown by the arrow in the figure) of the FPC, two sides of a cross section of an overall structure formed by the first adhesive part 16, the FPC 10, the third adhesive part 15, and the bracket 14 are all in a step shape. Further, it may be understood that the first adhesive part 16, the FPC 10, the third adhesive part 15, and the bracket 14 shrink inward layer by layer, and the cross section of the formed overall structure is similar to a "pyramid".

In some other implementations, in the width direction W of the FPC 10, only a part of edges of the two side edges of the bracket 14 may alternatively be located between the two side edges of the third adhesive part 15, and the remaining edge parts of the two side edges of the bracket 14 may be flush with the two side edges of the third adhesive part 15. In an implementation, in the width direction W of the FPC 10, the two side edges of the bracket are flush with the two sides of the third adhesive part, and one concave part 141B is disposed on each of the two side edges of the bracket (for details, refer to the bracket 14B shown in FIG. 7*a*).

In a thickness direction of the FPC (which may alternatively be understood as a depth direction of the mounting hole), being closer to the first wall surface 122 of the mounting hole 11 indicates a smaller gap that needs to be filled by the flowing adhesive, and fluidity of the flowing adhesive usually deteriorates over time. Therefore, the foregoing structure is used in this embodiment of this application, to avoid a phenomenon that a part of the gap is not filled due to poor fluidity of the flowing adhesive during processing.

Figure 5:
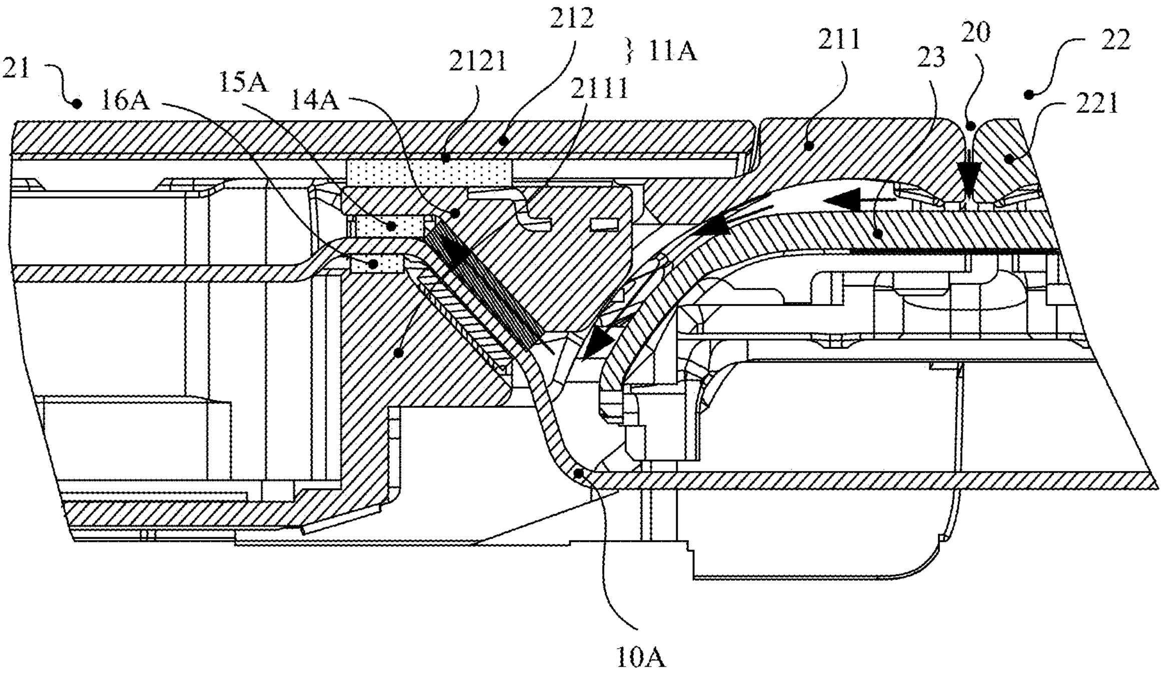
FIG. 5 is a schematic diagram of a structure of an FPC mounting module disposed close to a rotating shaft in an electronic device according to an embodiment of this application.

Refer to FIG. 5. FIG. 5 is a schematic diagram of a structure of an FPC mounting module disposed close to a rotating shaft in an electronic device according to an embodiment of this application. As shown in FIG. 5, this application provides an electronic device, including an FPC mounting module 1A. The FPC mounting module 1A may use the structure of the FPC mounting module 1 described in the implementations of the foregoing embodiments.

Specifically, the electronic device is a foldable electronic device. The foldable electronic device includes a first device body 21, a second device body 22, and a rotating shaft 23. The first device body 21 and the second device body 22 are connected by using the rotating shaft 23. The first device body 21 has a middle frame 211 and a rear cover 212, and the second device body 22 also has a middle frame 221 and a rear cover (not shown in the figure). In a process of using the foldable electronic device, both the first device body 21 and the second device body 22 can rotate around the rotating shaft 23. Therefore, a gap 20 for rotation between devices is provided between the middle frame 211 of the first device body 21 and the middle frame 221 of the second device body 22, and the FPC 10A penetrates the middle frame of the foldable electronic device. Specifically, the FPC 10A may penetrate, for example, a side frame 2111 of the middle frame 211 of the first device body 21. Water may enter inside of the electronic device along the gap 20, and flow to a location near the mounting hole of the mounting part 11A along a path shown by an arrow in FIG. 5.

The FPC 10A is configured to electrically connect an electronic unit of the first device body 21 and an electronic unit of the second device body 22. A mobile phone is used as an example. For example, a mainboard and a camera are disposed in the first device body 21, a USB interface, a power supply, and the like are disposed in the second device body 22, and the FPC 10A penetrates between the first device body 21 and the second device body 22, to implement an electrical connection between the mainboard, the USB interface, the camera, the power supply, and the like. In another alternative implementation, the camera and the mainboard may alternatively be disposed on different device bodies. In addition, the foregoing electronic unit is only an example for description. In a specific implementation process, the electronic unit may alternatively be another electronic unit.

Figure 6A:
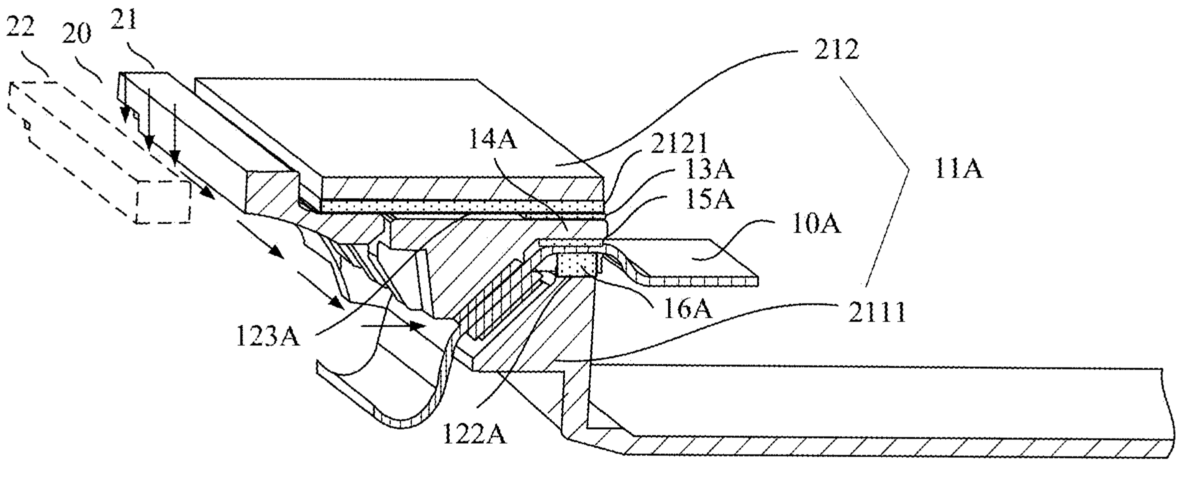
FIG. 6*a* is a sectional view of a three-dimensional structure of an FPC mounting module in an electronic device in a length direction of an FPC according to an embodiment of this application.
Figure 6B:
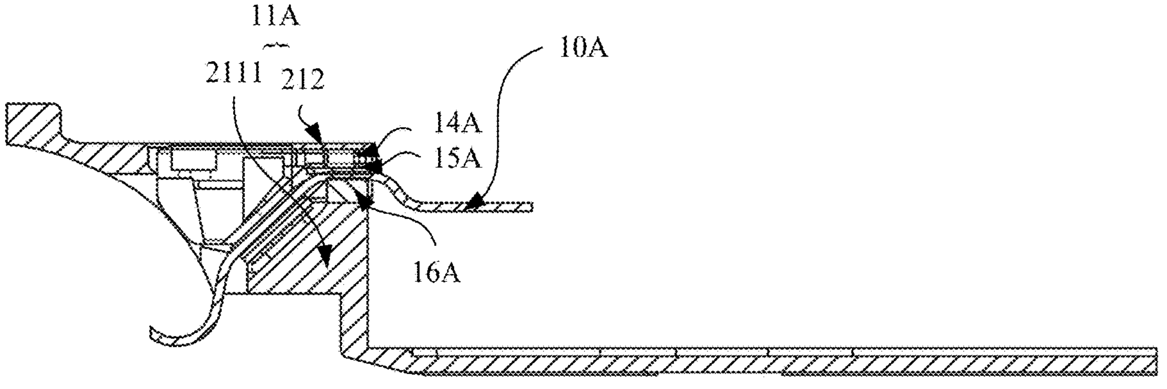
FIG. 6*b* is a sectional view of an FPC mounting module in an electronic device in a length direction of an FPC according to an embodiment of this application.
Figure 6C:
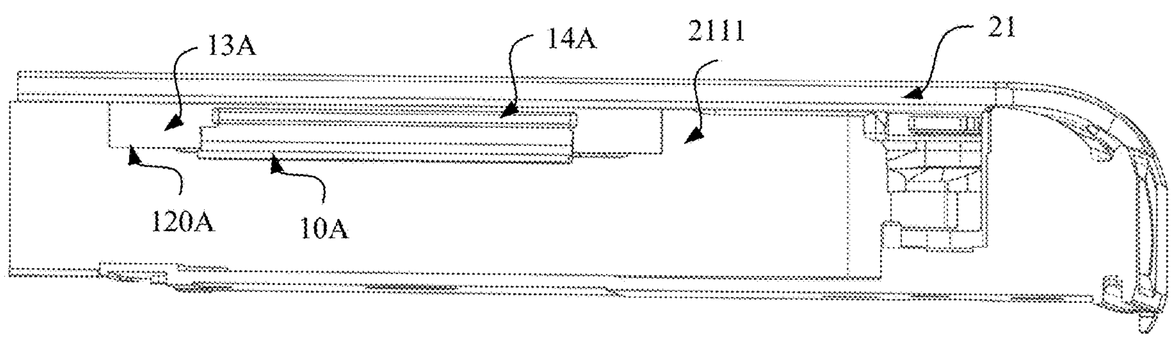
FIG. 6*c* is a side view of a three-dimensional structure of an FPC mounting module that is in an electronic device and that is disposed in an electronic device close to a rotating shaft according to an embodiment of this application.
Figure 6D:
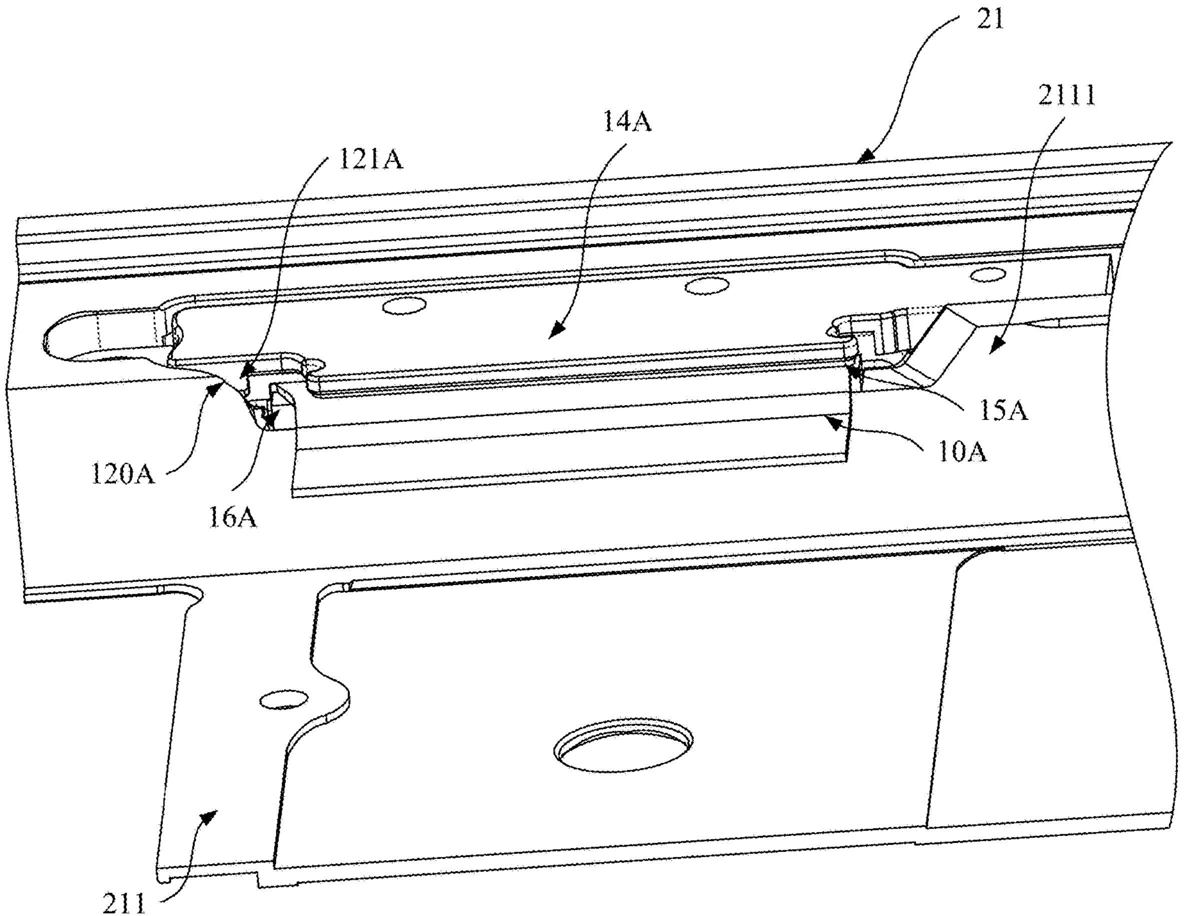
FIG. 6*d* is a schematic diagram of a three-dimensional structure of an FPC mounting module that is in an electronic device and that is disposed close to a rotating shaft in the electronic device according to an embodiment of this application.

Refer to FIG. 6*a* to FIG. 6*d*. FIG. 6*a* is a sectional view of a three-dimensional structure of an FPC mounting module in an electronic device in a length direction of an FPC according to an embodiment of this application. FIG. 6*b* is a sectional view of an FPC mounting module in an electronic device in a length direction of an FPC according to an embodiment of this application. FIG. 6*c* is a side view of a three-dimensional structure of an FPC mounting module that is in an electronic device and that is disposed in an electronic device close to a rotating shaft according to an embodiment of this application. FIG. 6*d* is a schematic diagram of a three-dimensional structure of an FPC mounting module that is in an electronic device and that is disposed close to a rotating shaft in the electronic device according to an embodiment of this application. For a water entering path of the electronic device, refer to arrows in FIG. 6*a*.

As shown in FIG. 5 to FIG. 6*d*, the rear cover 212 and the side frame 2111 that is in the middle frame 211 and that is close to the rotating shaft 23 form the mounting part 11A of the FPC mounting module 1A. Specifically, a mounting slot 120A is disposed on the side frame 2111 that is in the middle frame 211 and that is close to the rotating shaft 23, and the mounting slot 120A and the rear cover 212 are enclosed to form the mounting hole. A bottom surface of the mounting slot 120A forms a first wall surface 122A of the mounting hole, a part of a surface that is of the rear cover 212 and that is close to the mounting slot 120A forms a second wall surface 123A of the mounting hole. The rear cover 212 may include a back adhesive line 2121, and the rear cover 212 is glued to the side frame 2111 of the middle frame 211 by using the back adhesive line 2121.

Figure 7A:
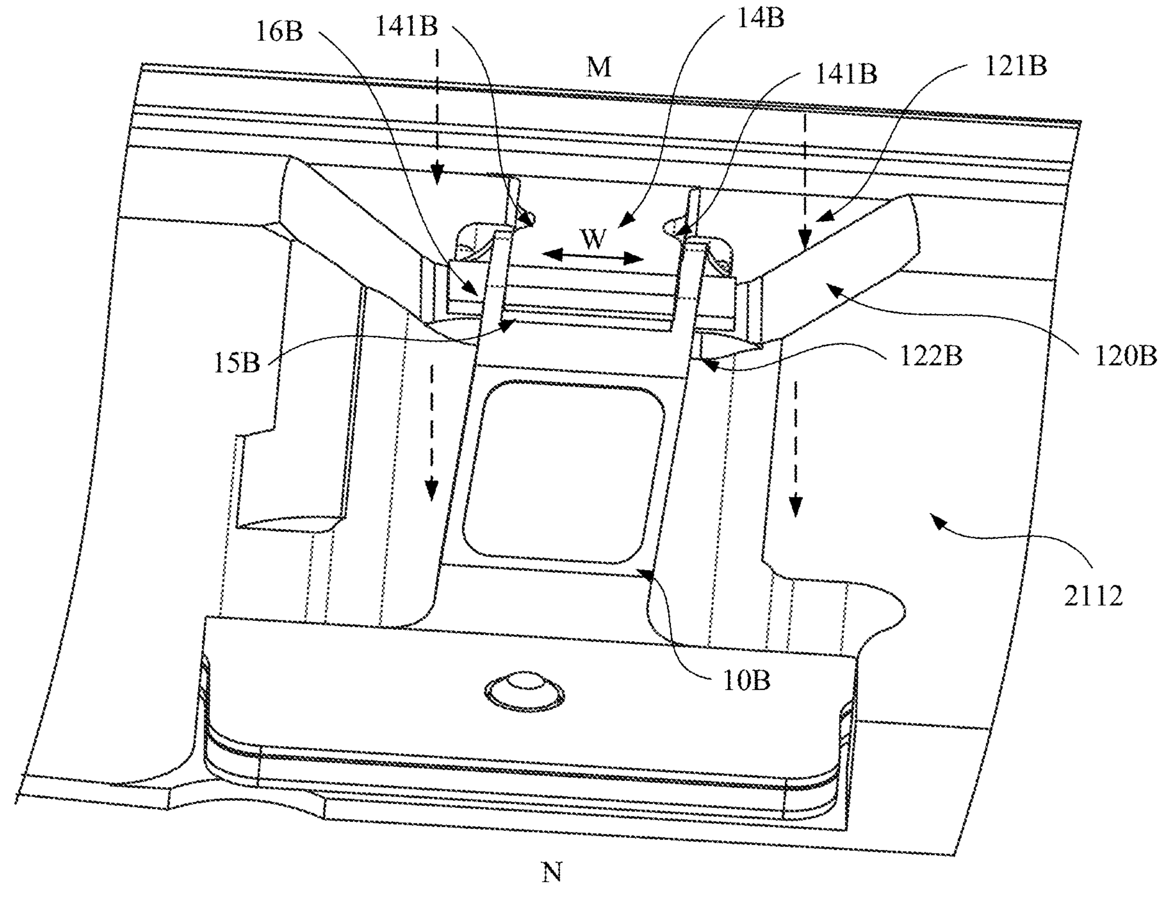
FIG. 7*a* is a schematic diagram that is of a three-dimensional structure of an FPC mounting module disposed at a button of an electronic device and that is obtained when no flowing adhesive is filled according to an embodiment of this application.
Figure 7B:
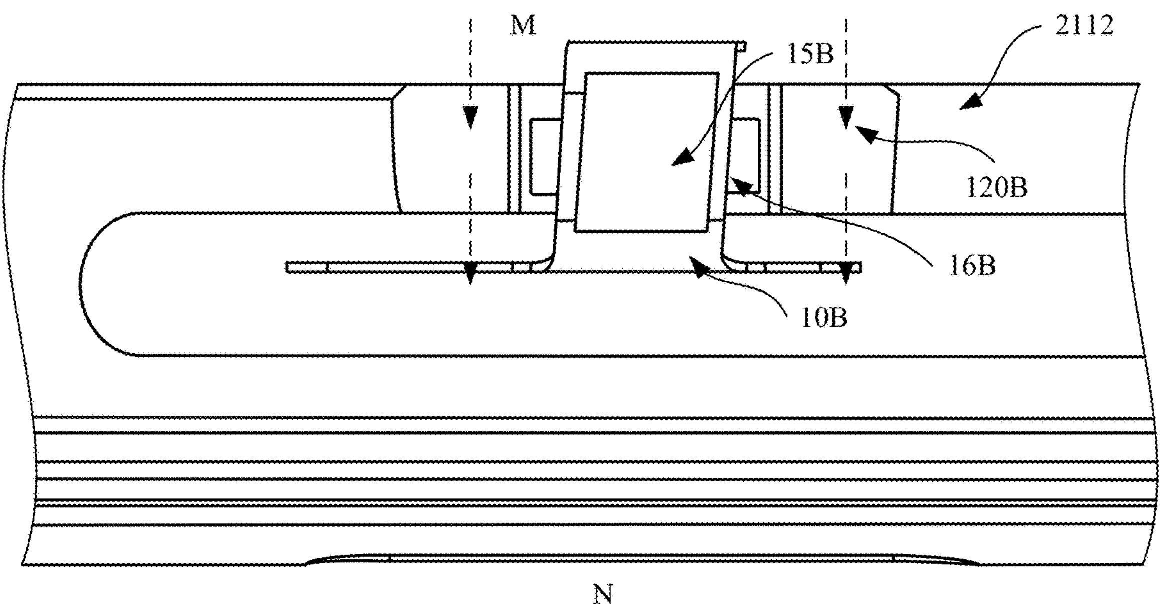
FIG. 7*b* is a schematic diagram that is of a top view structure of an FPC mounting module disposed at a button of an electronic device and that is obtained when no flowing adhesive is filled according to an embodiment of this application.

Further, refer to FIG. 7*a* and FIG. 7*b*. FIG. 7*a* is a schematic diagram that is of a three-dimensional structure of an FPC mounting module disposed at a button of an electronic device and that is obtained when no flowing adhesive is filled according to an embodiment of this application. FIG. 7*b* is a schematic diagram that is of a top view structure of an FPC mounting module disposed at a button of an electronic device and that is obtained when no flowing adhesive is filled according to an embodiment of this application. As shown in FIG. 7*a* and FIG. 7*b*, a foldable electronic device provided in this embodiment further includes an FPC mounting module 1B disposed at a button, and the FPC mounting module 1B may use the structure of the FPC mounting module 1 described in the implementations of the foregoing embodiments. The foldable electronic device has a button (not shown in the figure). In a use process of the electronic device, there is an assembly gap (not shown in the figure) between the button and a housing of the electronic device. Therefore, water may enter from the assembly gap, flow from an M side to an N side of a middle frame along a path shown by a dashed arrow in FIG. 7*b*, and flow to a location near a mounting hole on a side frame 2112 disposed opposite to the button. An FPC 10B may be an FPC configured to electrically connect a button contact to a mainboard of the electronic device.

Specifically, a side frame 2112 that is in the middle frame 211 of the first device body 21 and that is disposed opposite to a button and a rear cover (not shown in the figure) form a mounting part of the FPC mounting module 1B. A mounting slot 120B is disposed on the side frame 2112 of the middle frame 211, and the mounting slot 120B and the rear cover (not shown in the figure) are enclosed to form the mounting hole. A gap 121B is formed between the FPC 10B and an inner wall surface of the mounting hole after the FPC 10B penetrates the mounting hole. The gap 121B is filled with flowing adhesive by using a dispensing procedure, and then a second adhesive part is formed after the flowing adhesive is solidified.

A person skilled in the art may understand that the FPC mounting module 1B may be applied to a button of any electronic device, and specifically, may be applied to a button of a foldable electronic device, or may be applied to a button of a non-foldable electronic device. It should be noted that, when the FPC mounting module 1B is applied to the button of the non-foldable electronic device, the mounting part of the FPC mounting module 1B may be formed by enclosing a rear cover and a side frame that is in a middle frame of the electronic device and that is disposed opposite to the button.

Figure 8:
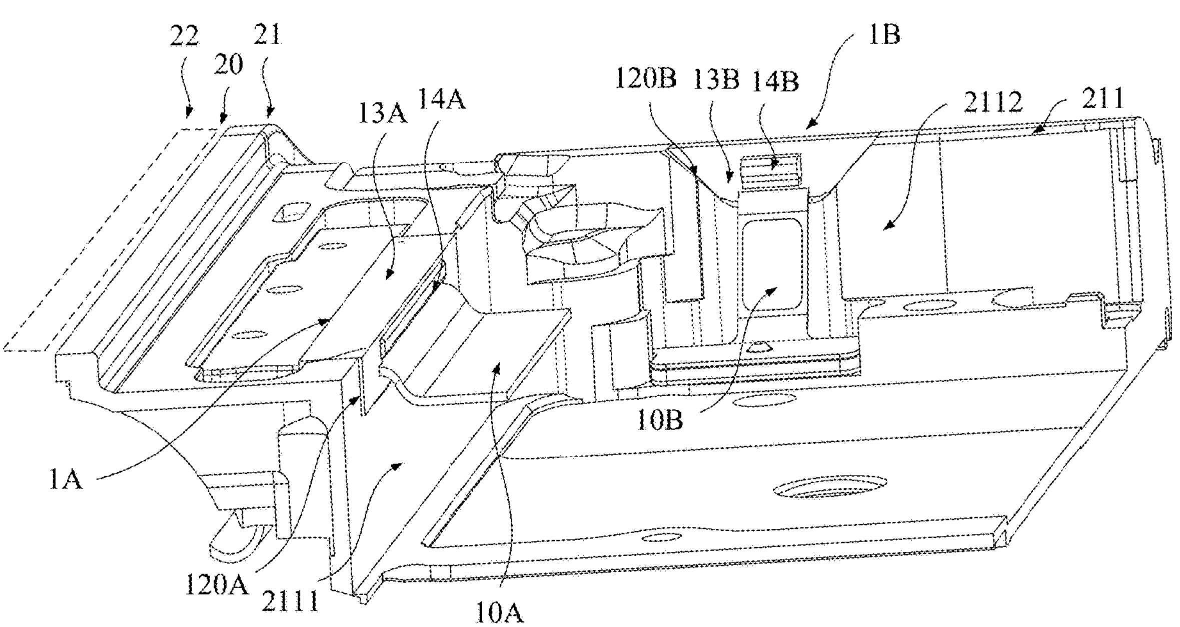
FIG. 8 is a schematic diagram of an internal structure of an electronic device according to an embodiment of this application.

Further, refer to FIG. 8. FIG. 8 is a schematic diagram of an internal structure of an electronic device according to an embodiment of this application. The electronic device is a foldable electronic device and has a button. For a structure of the foldable electronic device and a water entering path, refer to the foregoing description for understanding.

There are a plurality of FPC mounting modules, and the plurality of FPC mounting modules include an FPC mounting module 1A and an FPC mounting module 1B. The FPC mounting module 1A may use solutions shown in FIG. 5 to FIG. 6*d*. The FPC mounting module 1B may use solutions shown in FIG. 7*a* to FIG. 7*b*.

Specifically, a rear cover (not shown in the figure) of a first device body 21 and a side frame 2111 that is in a middle frame 211 of the first device body 21 and that is close to a rotating shaft form a mounting part of the FPC mounting module 1A. A mounting slot 120A is disposed on the side frame 2111 of the first device body 21, and the mounting slot 120A and the rear cover are enclosed to form a mounting hole of the FPC mounting module 1A.

The electronic device has a button, and the FPC mounting module 1B is disposed at the button. A rear cover (not shown in the figure) of the electronic device and a side frame 2112 that is in the middle frame 211 of the electronic device and that is disposed opposite to the button form a mounting part of the FPC mounting module 1B. A mounting slot 120B is disposed on the side frame 2112 that is in the middle frame 211 of the electronic device and that is disposed opposite to the button. The mounting slot 120B and the rear cover of the electronic device are enclosed to form a mounting hole of the FPC mounting module 1B.

It should be noted that, in this implementation, the FPC mounting module 1A and the FPC mounting module 1B are both disposed on the first device body 21. A person skilled in the art may understand that the FPC mounting module 1A and the FPC mounting module 1B may alternatively be both disposed on a second device body 22, or may be disposed on different device bodies.

Further, the plurality of FPC mounting modules further include an FPC mounting module disposed in the second device body 22. A structure of the FPC mounting module is the same as a structure of the FPC mounting module 1A. Specifically, the FPC mounting module 1A in the first device body 21 and the FPC mounting module in the second device body 22 may be symmetrically disposed with respect to the rotating shaft. In addition, an FPC 10A in the FPC mounting module 1A of the first device body 21 and an FPC in the FPC mounting module of the second device body 22 may be shared.

It can be learned that, in this embodiment of this application, the foregoing structure can be used to form a closed sealing structure around the FPC, to prevent water from entering a plurality of locations of the electronic device, for example, a rotating location of the foldable electronic device and a button location of the electronic device. This effectively prevents water from entering the rotating shaft of the foldable electronic device.

Figures 9, 10:
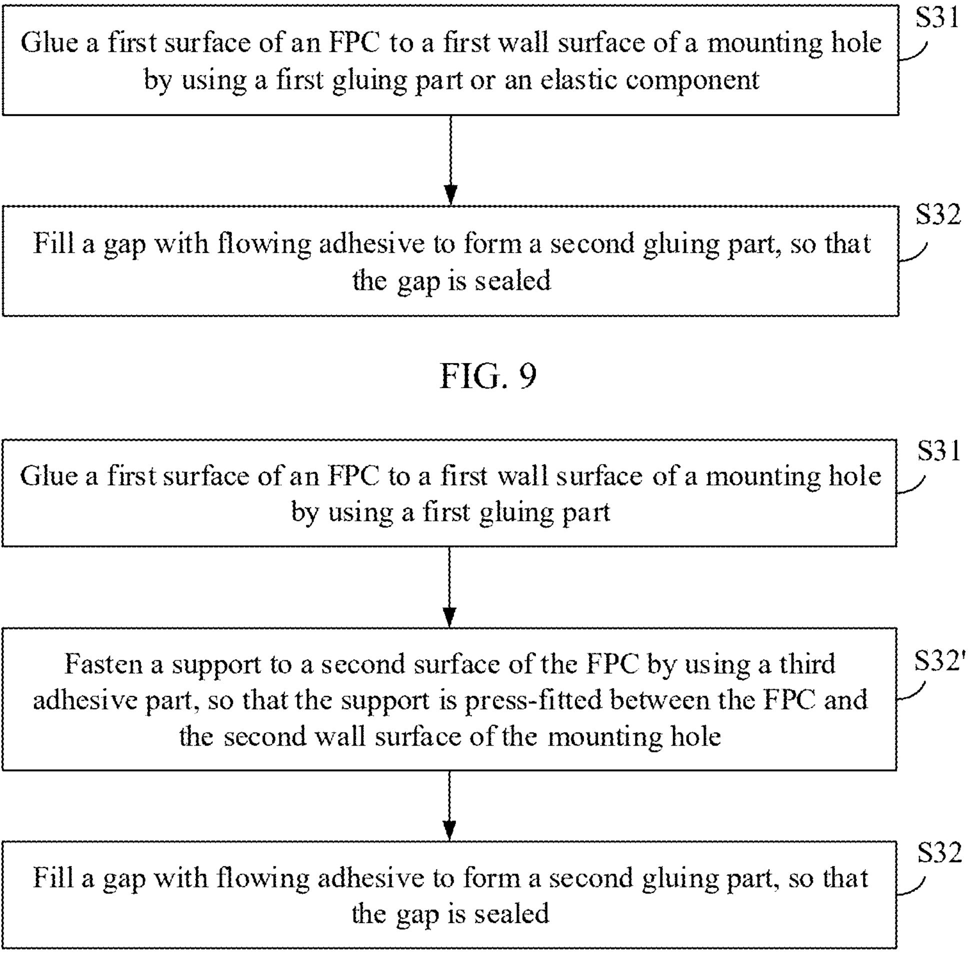
FIG. 9 is a schematic flowchart 1 of a method for mounting an FPC mounting module according to an embodiment of this application.
FIG. 10 is a schematic flowchart 2 of a method for mounting an FPC mounting module according to an embodiment of this application.

Refer to FIG. 9. FIG. 9 is a schematic flowchart 1 of a method for mounting an FPC mounting module according to an embodiment of this application.

This application further provides a method for mounting an FPC mounting module, including:

Operation S31: Glue a first surface of an FPC to a first wall surface of a mounting hole by using a first adhesive part.

Operation S32: Fill a gap with flowing adhesive to form a second adhesive part, so that the gap is sealed.

In some implementations, the first adhesive part and the second adhesive part may be a same type of adhesive, namely, flowing adhesive. Therefore, an operation process of operation S31 and operation S32 may be continuously implemented. For example, the flowing adhesive is filled between the first surface of the FPC and the first wall surface of the mounting hole by using a gel dispensing process to form the first adhesive part, and gel dispensing continues, so that the flowing adhesive is filled into the gap to form the second adhesive part. In another implementation, the first adhesive part and the second adhesive part may be different. Therefore, operation S31 and operation S32 may be performed discontinuously, that is, performed separately.

Further, refer to FIG. 10. FIG. 10 is a schematic flowchart 1 of a method for mounting an FPC mounting module according to an embodiment of this application. Before operation S32, the method further includes operation S32': Fix a bracket to a second surface of the FPC by using a third adhesive part, so that the bracket is press-fitted between the FPC and a second wall surface of the mounting hole.

In an example mounting process, operation S31 is first performed, then operation S32' is performed, and finally operation S32 is performed.

It is clearly that a person skilled in the art can make various modifications and variations to this application without departing from the spirit and scope of this application. In this way, this application is intended to cover these modifications and variations of this application provided that they fall within the scope of the claims of this application and their equivalent technologies.

What is claimed is:

1. A flexible printed circuit (FPC) mounting module, comprising:

a mounting part provided with a mounting hole; and an FPC penetrating the mounting hole, wherein there is a gap between the FPC and an inner wall surface of the mounting hole;

a first surface of the FPC is glued to a first wall surface of the mounting hole by using a first adhesive part; and a bracket and a third adhesive part, wherein the bracket is glued to a second surface of the FPC by using the third adhesive part, the second surface of the FPC is opposite to the first surface; and the gap is filled with flowing adhesive, to form a second adhesive part, and the FPC is sealed in and fastened to the mounting hole by using the second adhesive part.

2. The FPC mounting module of claim 1, wherein the bracket is press-fitted between the third adhesive part and a second wall surface of the mounting hole, and the second wall surface of the mounting hole is opposite to the first wall surface; and the FPC, the first adhesive part, the bracket, and the third adhesive part are sealed in and fastened to the mounting hole by using the second adhesive part.

3. The FPC mounting module of claim 2, wherein, in a width direction of the FPC, the FPC is located between two opposite side edges of the first adhesive part, the third adhesive part is located between two opposite side edges of the FPC, and the bracket is located between two opposite side edges of the third adhesive part.

4. The FPC mounting module of claim 2, wherein both the first adhesive part and the third adhesive part are double-sided adhesive.

5. The FPC mounting module of claim 1, wherein a cross-sectional shape of the mounting hole is a trapezoid.

6. An electronic device, comprising:

a flexible printed circuit (FPC) mounting module, comprising:

a mounting part provided with a mounting hole; and a FPC penetrating the mounting hole, wherein there is a gap between the FPC and an inner wall surface of the mounting hole;

a first surface of the FPC is glued to a first wall surface of the mounting hole by using a first adhesive part; and a bracket and a third adhesive part, wherein the bracket is glued to a second surface of the FPC by using the third adhesive part, the second surface of the FPC is opposite to the first surface; and the gap is filled with flowing adhesive, to form a second adhesive part, and the FPC is sealed in and fastened to the mounting hole by using the second adhesive part.

7. The electronic device of claim 6, wherein the bracket is press-fitted between the third adhesive part and a second wall surface of the mounting hole, and the second wall surface of the mounting hole is opposite to the first wall surface; and the FPC, the first adhesive part, the bracket, and the third adhesive part are sealed in and fastened to the mounting hole by using the second adhesive part.

8. The electronic device of claim 7, wherein, in a width direction of the FPC, the FPC is located between two opposite side edges of the first adhesive part, the third adhesive part is located between two opposite side edges of the FPC, and the bracket is located between two opposite side edges of the third adhesive part.

9. The electronic device of claim 7, wherein both the first adhesive part and the third adhesive part are double-sided adhesive.

10. The electronic device of claim 6, wherein a cross-sectional shape of the mounting hole is a trapezoid.

11. The electronic device of claim 6, wherein the electronic device has a button, and a side frame of a middle frame of the electronic device disposed opposite to the button and a rear cover of the electronic device form the mounting part; and a mounting slot is disposed on the side frame of the middle frame, and the mounting slot and the rear cover of the electronic device are enclosed to form the mounting hole.

12. The electronic device of claim 6, wherein the electronic device is a foldable electronic device comprising a first device body, a second device body, and a rotating shaft, and the first device body and the second device body are rotatably connected by using the rotating shaft; and the first device body has a middle frame and a rear cover, a side frame of the middle frame close to the rotating shaft and the rear cover form the mounting part, a mounting slot is disposed on the side frame of the middle frame, and the mounting slot and the rear cover are enclosed to form the mounting hole.

13. An electronic device, comprising:

a plurality of flexible printed circuit (FPC) mounting modules, each FPC module of the plurality of FPC mounting modules comprising:

a mounting part provided with a mounting hole; and a FPC penetrating the mounting hole, wherein there is a gap between the FPC and an inner wall surface of the mounting hole;

a first surface of the FPC is glued to a first wall surface of the mounting hole by using a first adhesive part; and the gap is filled with flowing adhesive, to form a second adhesive part, and the FPC is sealed in and fastened to the mounting hole by using the second adhesive part;

wherein the electronic device is a foldable electronic device comprising a first device body, a second device body, and a rotating shaft, and the first device body and the second device body are rotatably connected by using the rotating shaft;

the plurality of FPC mounting modules comprise a first FPC mounting module and a second FPC mounting module; a side frame of a middle frame of the first device body close to the rotating shaft and a rear cover of the first device body form a mounting part of the first FPC mounting module, a first mounting slot is disposed on the side frame of the middle frame of the first device body, and the first mounting slot and the rear cover are enclosed to form a mounting hole of the first FPC mounting module; and the electronic device has a button, a side frame of a middle frame of the electronic device disposed opposite to the button and a rear cover of the electronic device form a mounting part of the second FPC mounting module, a second mounting slot is disposed on the side frame of the middle frame of the electronic device disposed opposite to the button, and the second mounting slot and the rear cover of the electronic device are enclosed to form a mounting hole of the second FPC mounting module.

* * * * *